United States Patent [19]

Takagi

[11] Patent Number: 5,339,269
[45] Date of Patent: Aug. 16, 1994

[54] SEMICONDUCTOR MEMORY MODULE

[75] Inventor: Yuichi Takagi, Kanagawa, Japan

[73] Assignee: Sony Corporation, Tokyo, Japan

[21] Appl. No.: 922,266

[22] Filed: Jul. 30, 1992

[30] Foreign Application Priority Data

Jul. 30, 1991 [JP] Japan .................. 3-190374

[51] Int. Cl.$^5$ .............................................. G11C 5/14
[52] U.S. Cl. ........................................ 365/63; 365/51;
365/52; 365/226; 257/691
[58] Field of Search ............... 365/51, 52, 63, 72,
365/226; 361/414, 794; 257/691

[56] References Cited

U.S. PATENT DOCUMENTS

| 4,577,214 | 3/1986 | Schaper ................. 257/691 |
| 4,608,592 | 8/1986 | Miyamoto .............. 257/691 |
| 4,742,385 | 5/1988 | Kohmoto ............... 257/691 |
| 5,007,025 | 4/1991 | Hwang et al. ........ 365/226 |
| 5,119,169 | 6/1992 | Kozono et al. ....... 257/691 |
| 5,231,607 | 7/1993 | Yoshida et al. ...... 365/226 |

FOREIGN PATENT DOCUMENTS 59-215749 12/1984 Japan ...................... 257/691

Primary Examiner—Eugene R. LaRoche
Assistant Examiner—Andrew Tran
Attorney, Agent, or Firm—Pasquale Musacchio; Jerry A. Miller

[57] ABSTRACT

A memory module includes electrodes arranged on one side edge of a laminated substrate. A plurality of memory elements are mounted on the surface of the laminated substrate, wherein signal line electrodes for the memory elements are arranged on one side edge of the laminated substrate, and respective electrode terminals for a second power supply line and a second grounding line connected in parallel to a first power supply line and a first grounding line are provided on a surface of the laminated substrate. The electrodes are situated at a position at or near maximum amplitude of the potential distribution generated on the first power supply line and the first grounding line when the memory elements are driven.

9 Claims, 7 Drawing Sheets

SEMICONDUCTOR MEMORY MODULE

BACKGROUND OF THE INVENTION

1. Field of the Invention

The present invention relates to a memory module which carries a plurality of memory elements on the surface of a laminated substrate having electrodes arranged on one side edge of the substrate.

2. Description of the Prior Art

A conventional memory module will be explained with reference to FIGS. 1 and 2. In FIG. 1, numeral 2 indicates a laminated substrate. A plurality of memory elements 3, for example, static random access memories (SRAMs) are mounted on both sides of the laminated substrate 2. Further, supply electrodes Vcc and grounding electrodes Gnd for the memory elements 3 are linearly arranged along the one side edge of the laminated substrate 2 together with electrodes "In" for signal terminals (address terminal, control terminal and data terminal). These electrodes are generally referenced as numeral 4. Such a memory module 1 is inserted into a socket provided on a circuit substrate of an electronic instrument and is thereby connected to the other electronic circuit elements making up the electronic instrument.

When the removable memory module 1 is connected to its socket, electrodes for high impedance signal lines are not generally degraded in the electrical characteristics due to the configuration described above. However, electrodes for supply lines and ground lines exhibiting how impedances within the memory module 1 are often degraded in electrical characteristics, particularly, the AC characteristics arisen from the inductances and a non-linearity of the V-I characteristic accompanied by the contact with the socket.

More specifically, in a circuit as shown in FIG. 2, there possibly exist non-linear elements D and resistances R and inductances L caused by contamination and the like at an electrode 4 portion where the memory module 1 is brought in contact with the socket. The non-linear element D and the resistance R are not particularly active when carrying a constant current exceeding the specified magnitude. However, in the case where the supply current changes from, e.g., a non-current carrying state to a peak current carrying state, the memory elements 3 may not be supplied with adequate current. Consequently, there is a potential difference between the supply electrodes Vcc and the ground electrodes Gnd outside the memory module 1 and those inside the memory module 1.

The judgment as to which logic state exists should be executed on the basis of the ground level outside the memory module 1. However, this decision is actually executed on the supply and ground levels within the memory module 1. Therefore, in the case that the ground level within the memory module 1 is higher than that outside the memory module 1, a high signal input may be erroneously judged as a low signal input. Conversely, in the case that the ground level within the memory module 1 is lower, a low signal input may be erroneously judged as a high signal input.

For this reason, in the removable memory module, high speed memory elements have been rarely used. Also, in a memory module having a broad data bus range, when a number of bits are changed with the same timing, noise is often induced for the same reason, thus causing data error.

A conventional memory module 1 (for example, SBX1705 type SRAM, Sony Corp.) mounting four memory elements 3 (1M bit high speed SRAM, for example, CXK 581020, Sony Corp.) on one side surface and one memory element 3 (the same as the above) on the other side surface of the laminated substrate 2 are connected to a socket provided on an electronic instrument and assembled. A schmoo plot of an address access time $T_{AA}$, which gives such a noise characteristic, is shown in FIG. 3. In this figure, the ordinate shows a supply voltage V (v), and the abscissa shows an address access time $T_{AA}$ (ns), and also the low level input voltage $V_{IL}$ input in the memory elements 3 is set as 0.60 v, 0.65 v or 0.70 v. The other measurement conditions are as follows: temperature is room temperature 25° C.; high level input voltage $V_{IH}$ input in the memory module 3 is 2.2 v; and the threshold voltage $V_{TH}$ is 1.5 v.

In this schmoo plot, the left region represents a fail region essentially pertained to the memory module 1. Another fail region caused by noise is in the center and is represented by three kinds of hatchings.

Also, the output enable access (hereinafter referred to as OE access) of the same memory module 1 is examined for the noise characteristic, which results in the schmoo plot as shown in FIG. 4. In this figure, the ordinate shows a supply voltage V (v), and the abscissa shows an OE access time $T_{OE}$ (ns), and also the low level input voltage $V_{IL}$ input in the memory elements 3 is set as 0.55 v, 0.60 v or 0.70 v. Even in this schmoo plot, over the whole region of $T_{OE}$, there exists a fail region caused by noise at the supply voltage V exceeding 5.0 v.

SUMMARY OF THE INVENTION

The present invention alleviates the above problems. The object is to provide a memory module including electrodes arranged on one side edge of a laminated substrate and a plurality of memory elements mounted on the surface of the laminated substrate, wherein signal line electrodes for the memory elements are arranged on one side edge of the laminated substrate, and respective electrode terminals for a second power supply line and a second grounding line are connected in parallel to a first power supply line and a first grounding line, and are provided on a surface of the laminated substrate at or near a position which maximizes the amplitude of the potential distribution generated on the first power supply line and the first grounding line when the memory elements are driven.

Therefore, according to the present invention, even if the memory module carries high speed memory elements and is so constructed as to be freely removed, the AC characteristics can be stabilized. Furthermore, even memory modules having a broad data bus range exhibit improved anti-noise characteristic and to stabilized operation.

DETAILED DESCRIPTION OF THE PREFERRED EMBODIMENTS

Hereinafter, an embodiment of a memory module of the present invention will be described with reference to the accompanying drawings. Those skilled in the art will appreciate that other embodiment s are possible within the scope of the invention.

Figure 1:
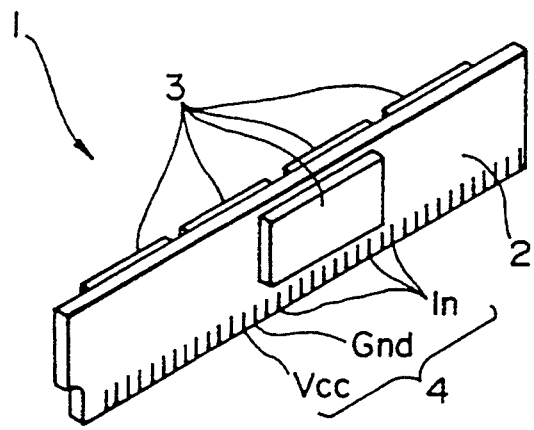
FIG. 1 is a perspective view of a conventional memory module.
Figure 2:
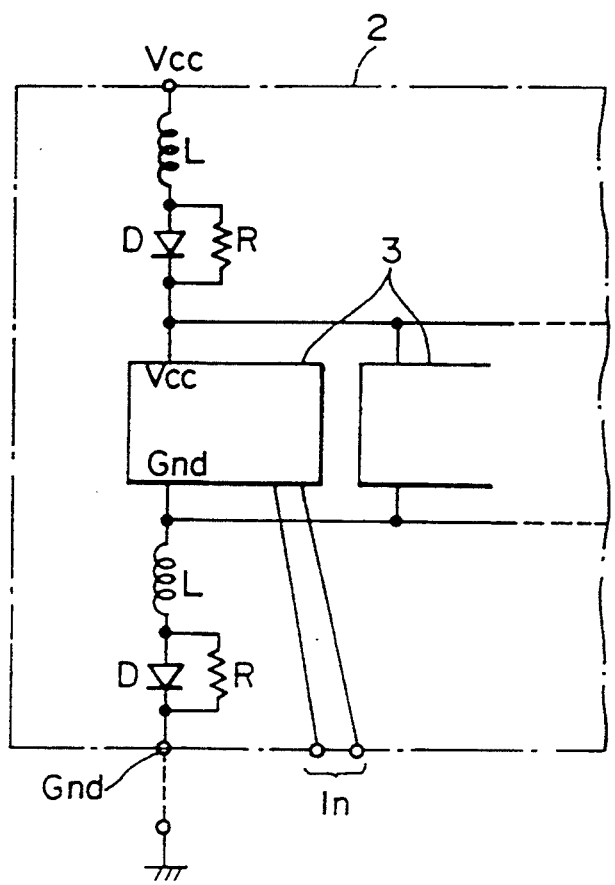
FIG. 2 is a partial circuit diagram for explaining the conventional memory module.
Figure 5:
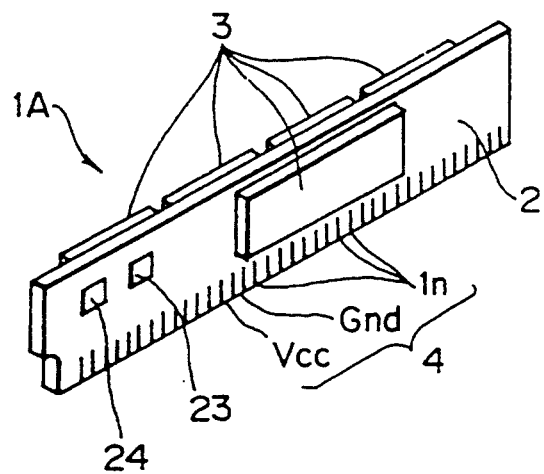
FIG. 5 is a perspective view of an embodiment of a memory module of the present invention.
Figure 6:
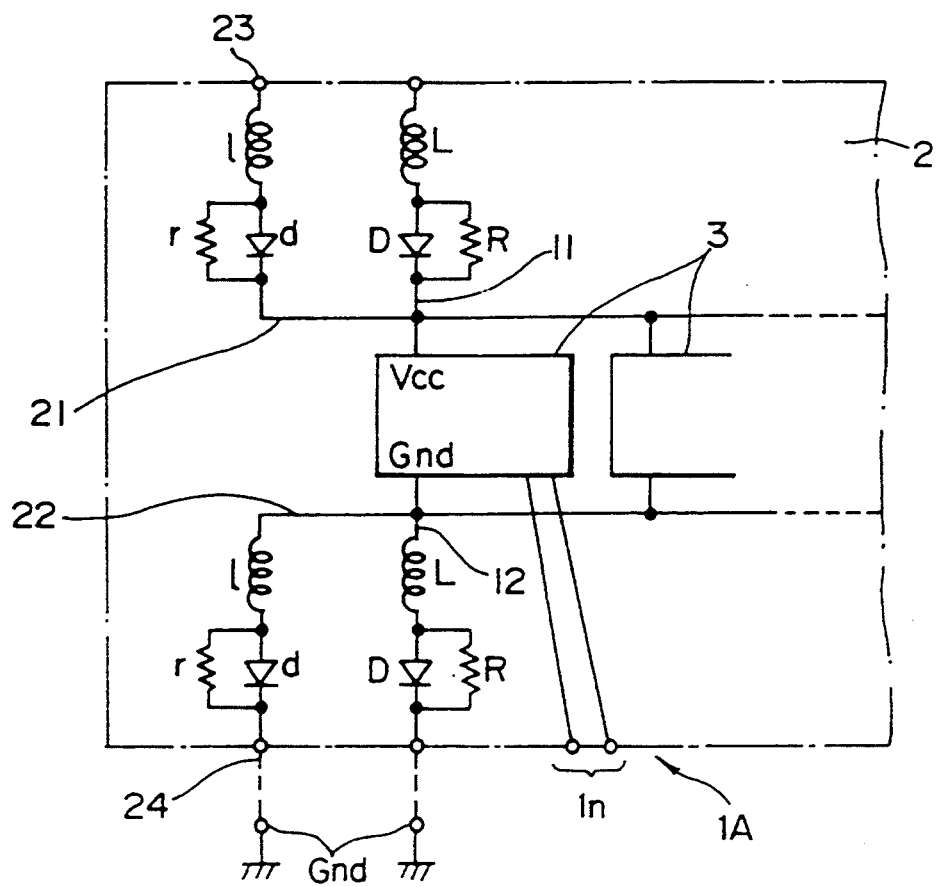
FIG. 6 is a partial circuit diagram for explaining the memory module of the present invention.
Figure 7:
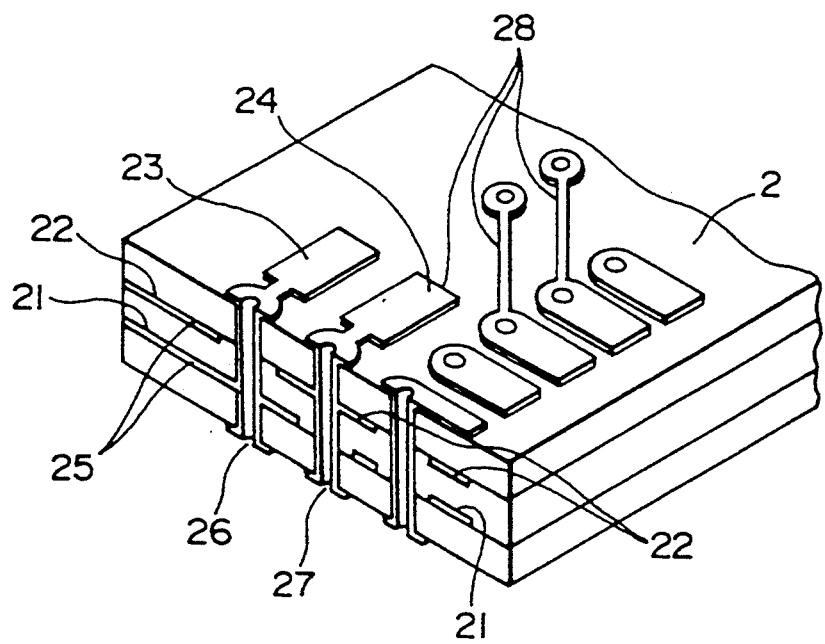
FIG. 7 is a partially enlarged cross-sectional perspective view of the memory module of the present invention.
Figure 8:
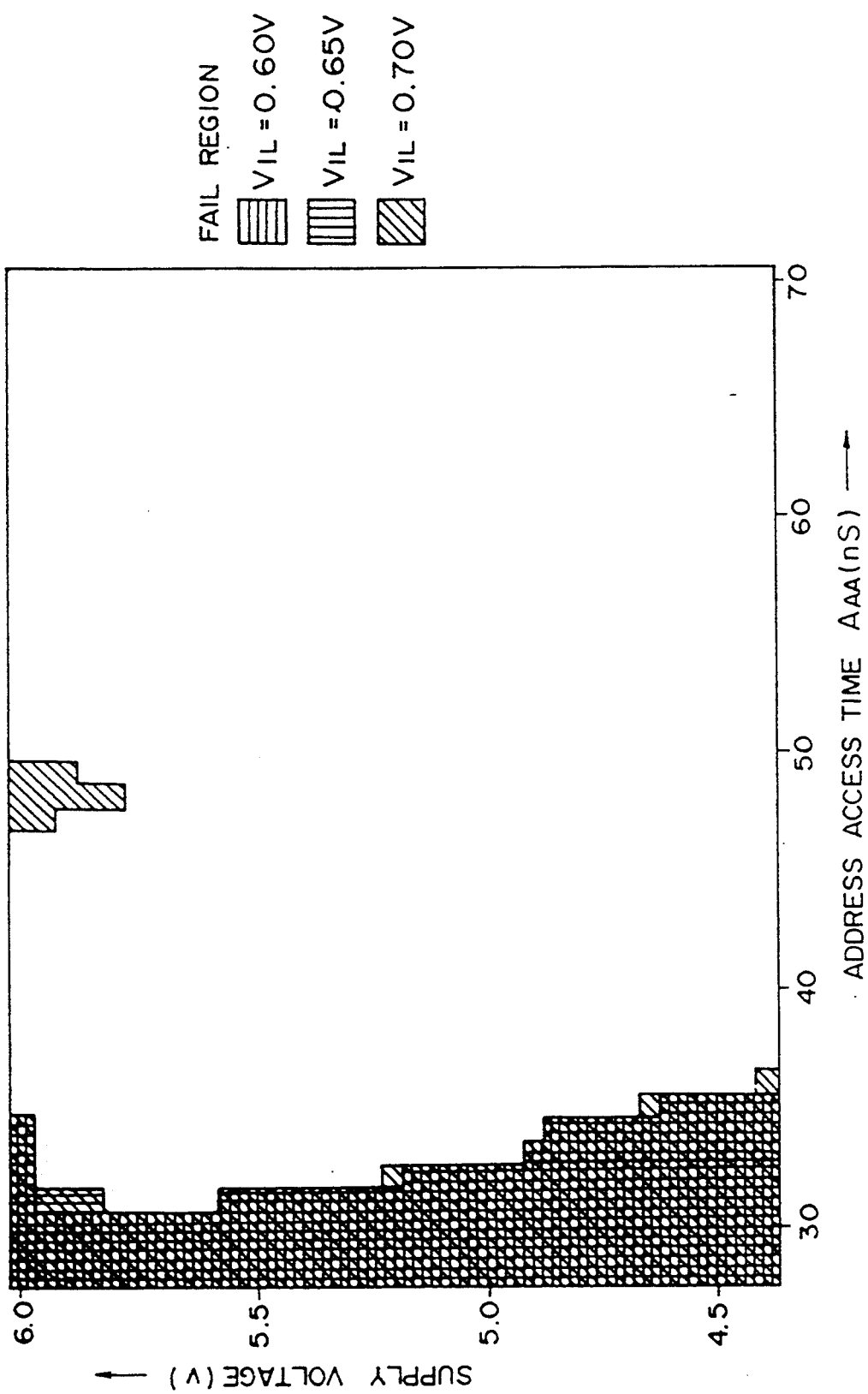
FIG. 8 is a schmoo plot of an address access time $T_{AA}$ in the memory module of the present invention.
Figure 9:
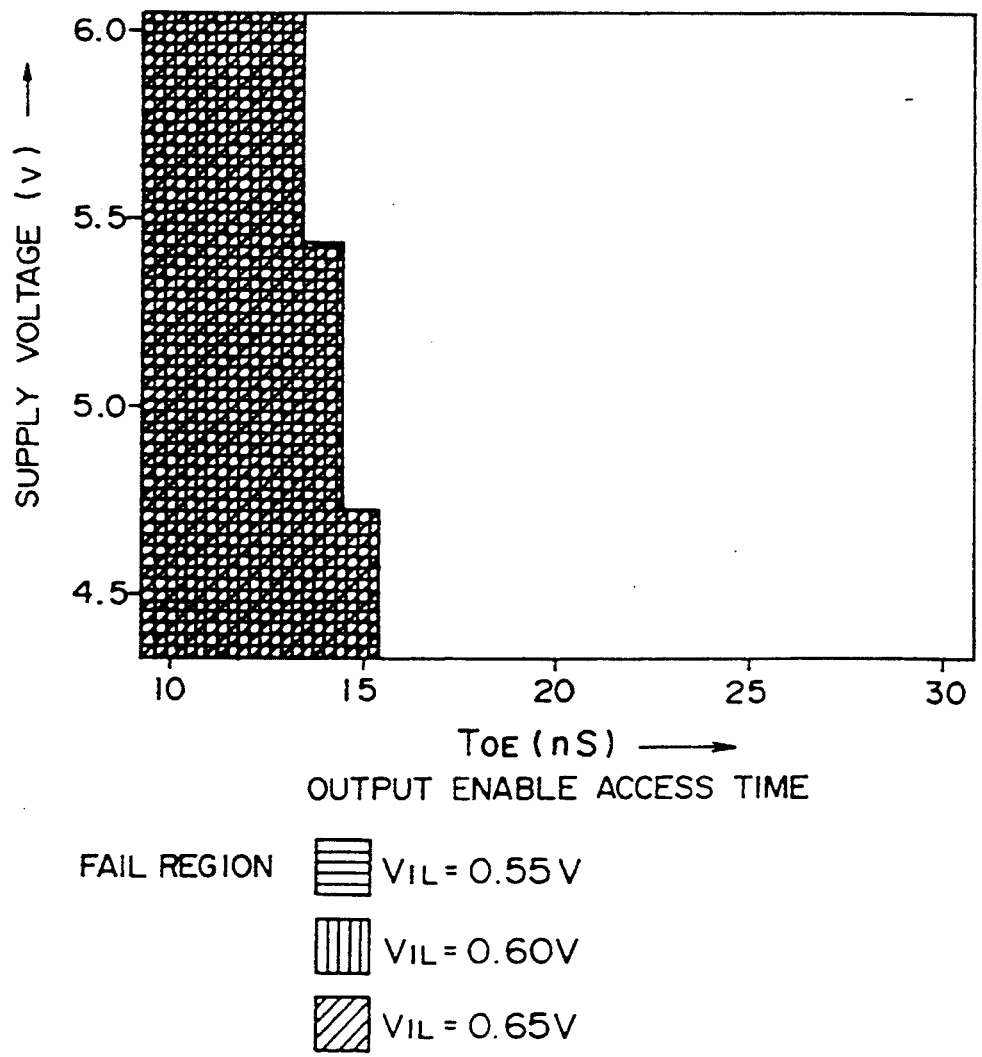
FIG. 9 is a schmoo plot of an output enable access time $T_{OE}$ in the memory module of the present invention.

FIG. 5 is a perspective view of one embodiment of the memory module according to the present invention. FIG. 6 is a partial circuit diagram for explaining the memory module in FIG. 5. FIG. 7 is a partially enlarged cross-sectional perspective view of the memory module in FIG. 5. FIG. 8 is a schmoo plot of an address access time $T_{AA}$ in the memory module of the present invention. FIG. 9 is a schmoo plot of an output enable access time $T_{OE}$ in the memory module of the present invention as compared with the schmoo plot in FIG. 8. Parts similar to those previously described with reference to FIGS. 1 and 2 are indicated by the same reference numerals.

The embodiment of the memory module according to the present invention will be explained with reference to FIGS. 5 to 7. The explanation of the same parts as in FIGS. 1 and 2 is omitted. In a memory module 1A of the present invention, as shown in FIG. 6, a second power supply line 21 and a second grounding line 22 are connected in parallel to a first power supply line 11 and a first grounding line 12, respectively. Further, a second supply electrode terminal 23 and a second grounding electrode terminal 24 are provided on a laminated substrate 2 in such a manner as to be exposed on the surface thereof, as shown in FIG. 5. The second electrode terminals 23 and 24 are positioned, at or near a portion of substrate 2 where the maximum amplitude of the voltage distribution generated at the first power supply line 11 and the first grounding line 12 appears when the module is driven.

In the supply electrode terminal 23 and the grounding electrode terminal 24, using the conventional technique as shown in FIG. 7, for example, the second power supply line 21 is formed on the lower layer side of an inner layer wiring pattern 25 of the laminated substrate 2 having four conductive layers. The second ground line 22 is formed on the upper side of the inner layer wiring pattern 25, and these are respectively connected to through holes 26 and 27 and are led out to outer layer wiring patterns 28. The supply electrode terminal 23 and the ground electrode terminal 24 are respectively connected to the external supply electrode Vcc and the grounding electrode Gnd of the electronic instrument, through a connector, or directly using a lead.

Figure 3:
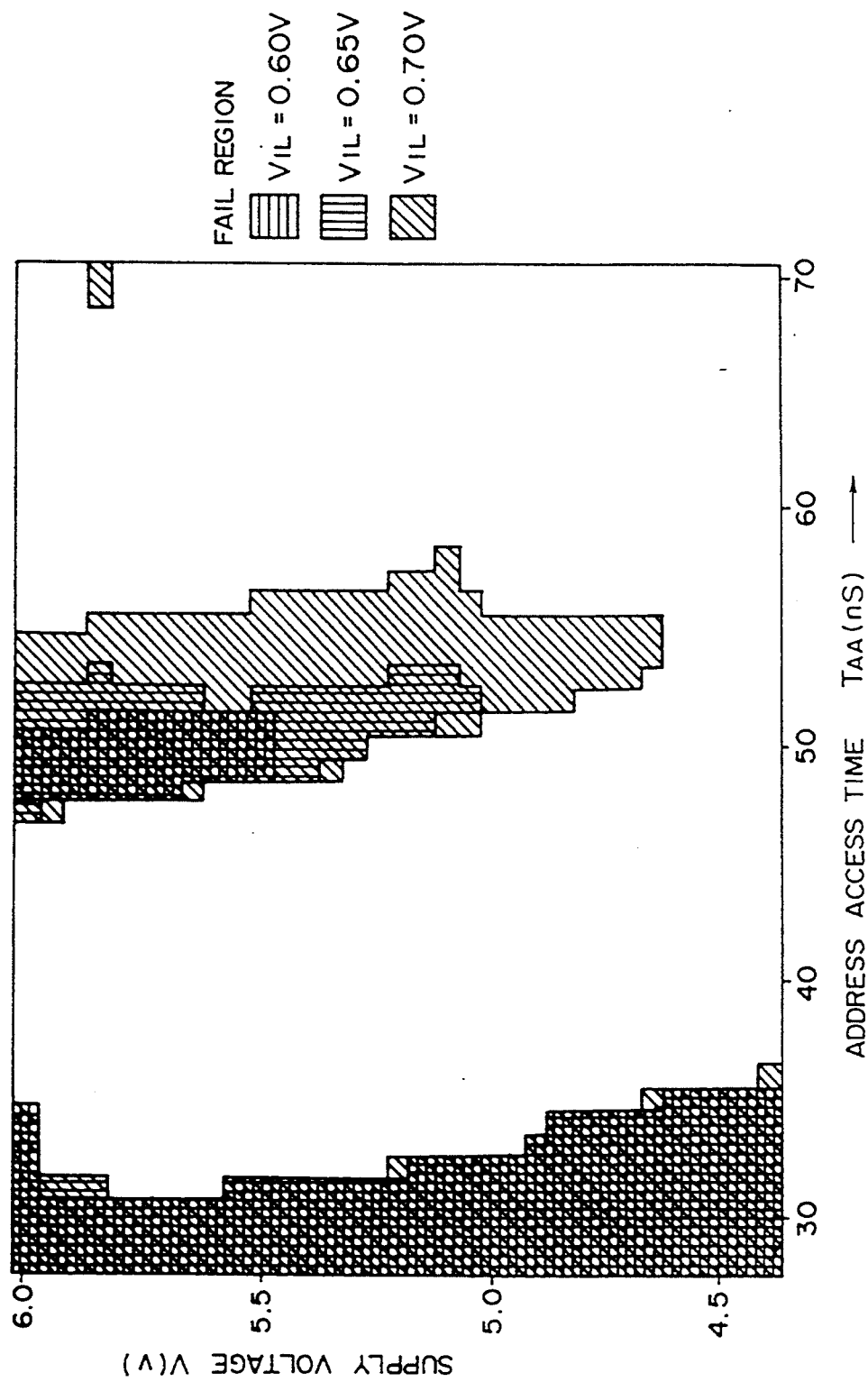
FIG. 3 is a schmoo plot of an address access time $T_{AA}$ in the conventional memory module.

The schmoo plot of FIG. 8 shows noise characteristics for the module under the same conditions as those of FIG. 3. To prepare this plot, the memory module 1A of the present invention, having the construction mentioned above, is connected and assembled to the socket provided on the electronic instrument, and the supply electrode terminal 23 and the ground electrode terminal 24 are respectively connected to the external supply electrode Vcc and the grounding electrode Gnd by a lead.

It becomes apparent from the comparison between FIGS. 8 and 3 that when the voltage $V_{IL}$ is 0.70 v and the $T_{AA}$ is near approximately 50 ns, there is only a small amount of noise. That is, the noise characteristic is significantly improved.

Figure 4:
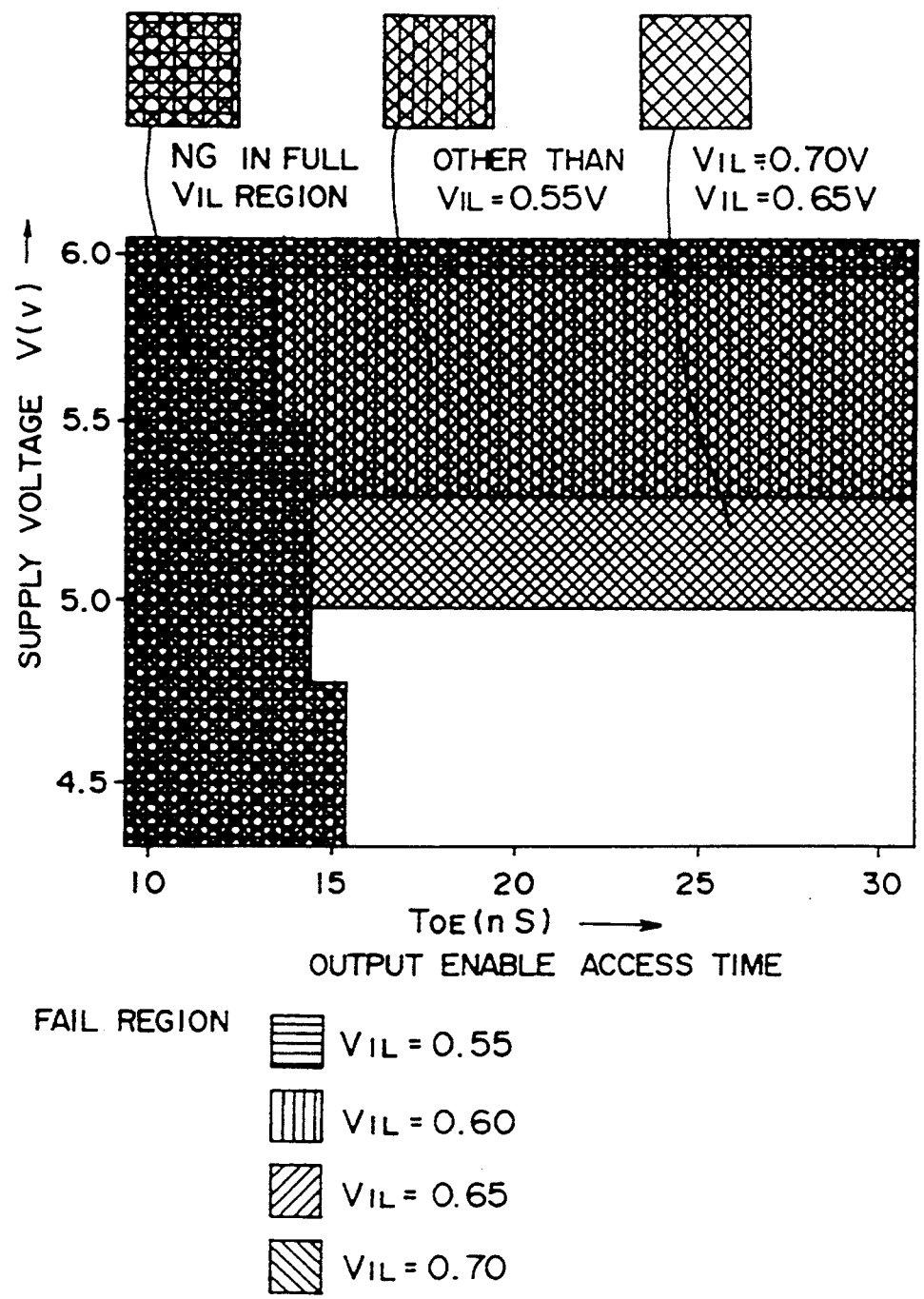
FIG. 4 is a schmoo plot of an output enable access time $T_{OE}$ in the conventional memory module.

FIG. 9 is prepared under the see conditions as those of FIG. 4. This schmoo plot shows the OE access time $T_{OE}$ in the memory module of the present invention. From the comparison between FIGS. 9 and 4, it is apparent that the noise characteristic is improved even at high speed, for example, OE access time $T_{OE}$ of 15 ns.

The improvement in the noise characteristic, as mentioned above, is dependent on the following: respective electrode terminals for the second power supply line 21 and the second ground line 22 connected in parallel to the first power supply line 11 and the first ground line 12 are provided on the surface of the laminated substrate at the portion of the substrate where the amplitude of the voltage distribution generated at the first supply line 11 and the first grounding line 12 of the laminated substrate 2 when each memory element is activated.

Namely, the parallel connection between the second power supply line 21 and the second ground line 22 function to reduce the impedance generated at the first power supply line 11 and the first grounding line 12 when the memory module 1 is connected to the socket, thereby reducing the level difference between the external grounding electrode and the internal grounding electrode. Although there exist the inductances I, non-linear elements $<d>$ and the resistances $<r>$ at the second power supply line 21 and the second grounding line 22 they are very small values and may be neglected.

In the above embodiment, the present invention has been explained with respect to the memory module 1A having a plurality of memory elements 3 on one side surface and one memory element 3 on the other side surface of thereof. However, this invention may be applicable for such a memory module 1A having the memory elements only on one side surface of the laminated substrate 2. Other variations will occur to those skilled in the art.

As mentioned above, even if the memory module of the present invention carries high speed memory elements and is so constructed as to be freely removed, the AC characteristics can be stabilized. It is even possible to improve the anti-noise property and stabilize the operation of memory modules having a broad data bus range.

Thus it is apparent that in accordance with the present invention, an apparatus that fully satisfies the objectives, aims and advantages is set forth above. While the invention has been described in conjunction with specific embodiments, it is evident that many alternatives, modifications, permutations and variations will become apparent to those skilled in the art in light of the foregoing description. Accordingly, it is intended that the present invention embrace all such alternatives, modifications and variations as fall within the scope of the appended claims.

What is claimed is:

1. A memory module comprising:

electrodes arranged on one side edge of a laminated substrate; and a plurality of memory elements mounted on the surface of said laminated substrate, wherein signal line electrodes for said memory elements are arranged on one side edge of said laminated substrate, and respective electrode terminals for a second power supply line and a second grounding line connected in parallel to a first power supply line and a first grounding line are provided on a surface of said laminated substrate, at a position of the substrate wherein the amplitude of the voltage distribution generated on said first power supply line and said first grounding line when said memory elements are driven is maximized.

2. A memory module, comprising:

a laminated substrate;

first and second sets of power supply line patterns and grounding line patterns which are provided on and inside said laminated substrate;

first and second electrodes provided on one side of said laminated substrate;

a signal line pattern provided on and inside said laminated substrate;

wherein one end of said first and second power supply line patterns are connected to each other on or inside said laminated substrate, one end of said first and second grounding line patterns are connected to each other on or inside said laminated substrate, the other ends of said first set of power supply and grounding line patterns are connected to said first and second electrodes respectively, and wherein the other ends of said second set of power supply and grounding line patterns are provided at or around the location on said substrate where the voltage distribution on said first set of power supply and grounding line patterns is maximum when said memory devices are driven.

3. An electronic circuit module, comprising:

a substrate having at least two surfaces and an edge with a plurality of contacts adjacent said edge;

a circuit mounted to a first one of said surfaces;

a first conductive power supply line at least a portion of which is on said first one of said surfaces providing an electrical power supply connection between said circuit and one of said contacts;

a first electrode situated on a second of said surfaces;

a second conductive power supply line on one of said surfaces connecting said circuit to said first electrode; and wherein said first electrode is located adjacent the maximum voltage distribution on said first conductive power supply line when said circuit is driven.

4. The apparatus of claim 3, wherein said circuit includes a memory element.

5. The apparatus of claim 3, wherein said circuit includes a plurality of memory elements.

6. The apparatus of claim 3, wherein said substrate is a laminated substrate.

7. The apparatus of claim 4, wherein said memory element includes a static random access memory.

8. The apparatus of claim 3, further comprising:

a first conductive ground line at least a portion of which is on said first one of said surfaces providing a ground connection between said circuit and a second of said contacts;

a second electrode situated on said second of said surfaces;

a second conductive ground line on one of said surfaces connecting said circuit to said second electrode; and wherein said second electrode is located adjacent the maximum voltage distribution on said first conductive ground line when said circuit is driven.

9. An electronic circuit module, comprising:

a laminated substrate having at least two external surfaces and at least one internal surface and an edge with a plurality of contacts adjacent said edge;

an electrical circuit comprising a plurality of static random access memory elements mounted to a first one of said surfaces;

a first conductive power supply line at least a portion of which is on said first one of said surfaces providing an electrical power supply connection between said circuit and one of said contacts;

a first electrode situated on a second of said surfaces;

a second conductive power supply line on one of said surfaces connecting said circuit to said first electrode;

wherein said first electrode is located adjacent the maximum voltage distribution on said first conductive power supply line when said circuit is driven;

a first conductive ground line at least a portion of which is on said first one of said surfaces providing a ground connection between said circuit and a second of said contacts;

a second electrode situated on said second of said surfaces;

a second conductive ground line on one of said surfaces connecting said circuit to said second electrode; and wherein said second electrode is located adjacent the maximum voltage distribution on said first conductive ground line when said circuit is driven.

* * * * *